US012635117B2

(12) United States Patent
Katsuki et al.

(10) Patent No.: US 12,635,117 B2
(45) Date of Patent: May 19, 2026

(54) ELECTROMAGNETIC WAVE SHIELD FILM

(71) Applicant: TATSUTA ELECTRIC WIRE & CABLE CO., LTD., Osaka (JP)

(72) Inventors: Takahiko Katsuki, Kyoto (JP); Hiroshi Tajima, Kyoto (JP); Sirou Yamauchi, Kyoto (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 107 days.

(21) Appl. No.: 18/848,792

(22) PCT Filed: Mar. 17, 2023

(86) PCT No.: PCT/JP2023/010577
§ 371 (c)(1),
(2) Date: Sep. 19, 2024

(87) PCT Pub. No.: WO2023/182204
PCT Pub. Date: Sep. 28, 2023

(65) Prior Publication Data
US 2025/0227906 A1 Jul. 10, 2025

(30) Foreign Application Priority Data

Mar. 22, 2022 (JP) ................................. 2022-045662

(51) Int. Cl.
*H05K 9/00* (2006.01)
(52) U.S. Cl.
CPC .................................. *H05K 9/0083* (2013.01)

(58) Field of Classification Search
CPC ................................................... H05K 9/0083
See application file for complete search history.

(56) References Cited

U.S. PATENT DOCUMENTS

| | | | |
|---|---|---|---|
| 2006/0162770 A1* | 7/2006 | Matsui ................. | H01G 9/2068 136/263 |
| 2021/0212197 A1* | 7/2021 | Watanabe ............. | B32B 15/098 |
| 2023/0086849 A1* | 3/2023 | Katsuki ................ | H05K 1/0215 174/350 |

(Continued)

FOREIGN PATENT DOCUMENTS

| | | |
|---|---|---|
| JP | 2007220243 A | 8/2007 |
| JP | 2013168258 A | 8/2013 |

(Continued)

OTHER PUBLICATIONS

International Search Report (ISR) dated Jun. 13, 2023 filed in PCT/JP2023/010577.

*Primary Examiner* — Hung V Ngo
(74) *Attorney, Agent, or Firm* — RANKIN, HILL & CLARK LLP

(57) ABSTRACT

Provided is an electromagnetic wave shielding film from which static electricity that has accumulated during production or transfer can be easily dissipated. An electromagnetic wave shielding film of the present invention includes a protective layer disposed outermost and a shielding layer stacked inward from the protective layer, wherein the protective layer has a surface resistivity of $1.0 \times 10^5$ to $2.0 \times 10^{12} \Omega/\square$, and the protective layer contains a binder resin and carbon particles having an average particle size of 0.1 to 15 µm.

4 Claims, 1 Drawing Sheet

(56)          References Cited

U.S. PATENT DOCUMENTS

2023/0337408  A1 *  10/2023   Yanagi ................. H05K 1/0268

FOREIGN PATENT DOCUMENTS

| | | | |
|---|---|---|---|
| JP | 2014140983 | A | 8/2014 |
| JP | 2016143751 | A | 8/2016 |
| JP | 2020136437 | A | 8/2020 |
| JP | 2021144869 | A | 9/2021 |

* cited by examiner

ELECTROMAGNETIC WAVE SHIELD FILM

TECHNICAL FIELD

The present invention relates to an electromagnetic wave shielding film.

BACKGROUND ART

In conventional practice, an electromagnetic wave shielding film is attached to a printed wiring board, such as a flexible printed wiring board (FPC), to shield the printed wiring board from external electromagnetic waves.

Usually, an electromagnetic wave shielding film has a configuration in which a conductive adhesive layer, a shielding layer made of a thin metal film or the like, and an insulating layer are sequentially stacked. When such an electromagnetic wave shielding film is thermally pressed while it is overlaid on a printed wiring board, the electromagnetic wave shielding film is adhered to the printed wiring board with an adhesive layer, whereby a shielded printed wiring board is produced. After adhesion, components are mounted onto the printed wiring board by solder reflow. The printed wiring board has a configuration in which printed patterns on a base film are covered with an insulating film.

As an example of such an electromagnetic wave shielding film, Patent Literature 1 discloses an electromagnetic wave shielding film including an insulating resin layer, a shielding layer adjacent to the insulating resin layer, and a conductive adhesive layer provided on the side opposite to the insulating resin layer of the shielding layer, wherein the shielding layer includes a plurality of metal layers having a thickness of 1 μm or less, and a non-metal layer interposed between the plurality of metal layers.

Patent Literature 2 discloses an electromagnetic wave shielding sheet including a conductive layer and an insulating layer, wherein the insulating layer contains a thermosetting resin, a setting agent, and a black coloring agent, and the average primary particle size of the black coloring agent is 20 to 100 nm.

CITATION LIST

Patent Literature

Patent Literature 1: JP 2020-136437 A
Patent Literature 2: JP 2016-143751 A

SUMMARY OF INVENTION

Technical Problem

In production of the electromagnetic wave shielding film disclosed in Patent Literature 1, the electromagnetic wave shielding film is transferred between rollers. Static electricity is generated in the insulating layer by contact between the insulating layer and the rollers. In the case where static electricity is generated in the insulating layer, electric current does not flow easily even when the insulating layer is earthed, resulting in accumulation of static electricity.

Subsequently, the electromagnetic wave shielding film is cut, and the cut pieces are stacked and stored.

Accumulation of static electricity in the insulating layer causes problems such as one that the electromagnetic wave shielding film cannot be smoothly cut during cutting, and one that a cut piece of the electromagnetic wave shielding film cannot be easily separated from another cut piece when it needs to be individually taken out for use after storage, because they are attached to each other (i.e., blocking).

In the electromagnetic wave shielding sheet according to Patent Literature 2, the insulating layer contains a black coloring agent having conductivity. However, in the case where static electricity is generated in the insulating layer, even when the insulating layer is earthed, electric current does not flow easily, resulting in accumulation of static electricity. Thus, blocking occurs also in the electromagnetic wave shielding sheet according to Patent Literature 2. In addition, since the average particle size of the black coloring agent is as small as 20 to 100 nm, the insulating layer has smaller irregularities on the surface, which gives gloss to the insulating layer. This causes a problem that when the insulating layer is scratched or the like on the surface, scratch marks or the like are easily visible.

The present invention was made to solve the above problems and aims to provide an electromagnetic wave shielding film from which static electricity that has accumulated during production or transfer can be easily dissipated.

Solution to Problem

An electromagnetic wave shielding film of the present invention includes a protective layer disposed outermost and a shielding layer stacked inward from the protective layer, wherein the protective layer has a surface resistivity of $1.0 \times 10^5$ to $2.0 \times 10^{12} \Omega/\square$, and the protective layer contains a binder resin and carbon particles having an average particle size of 0.1 to 15 μm.

In the electromagnetic wave shielding film of the present invention, the protective layer disposed outermost has a surface resistivity of $1.0 \times 10^5$ to $2.0 \times 10^{12} \Omega/\square$.

When the surface resistivity of the protective layer is in the above range, the protective layer can diffuse static electricity, so that even when static electricity accumulates in the protective layer, the static electricity that has accumulated in the protective layer can be quickly dissipated by earthing.

As a result, static electricity is less likely to accumulate in the entire electromagnetic wave shielding film.

When the surface resistivity is less than $1.0 \times 10^5$ $\Omega/\square$, static electricity can be dissipated instantly, but dissipation of static electricity tends to cause sparks.

When the surface resistivity is more than $2.0 \times 10^{12} \Omega/\square$, even when the protective layer is earthed, electric current does not flow easily. Thus, static electricity is not easily dissipated.

In the electromagnetic wave shielding film of the present invention, the protective layer contains a binder resin and carbon particles having an average particle size of 0.1 to 15 μm.

When the protective layer contains carbon particles having an average particle size in the above range, the carbon particles are moderately exposed on the surface of the protective layer, and the surface resistivity of the protective layer can be set to $1.0 \times 10^5$ to $2.0 \times 10^{12} \Omega/\square$. In addition, since irregularities are formed on the surface of the protective layer, the gloss of the protective layer can be reduced. Thus, even when the protective layer is scratched or the like, scratch marks or the like are not easily visible.

When the average particle size of the carbon particles is less than 0.1 μm, the carbon particles are buried in the protective layer and are less likely to be exposed on the surface of the protective layer. Thus, even when the protective layer is earthed, electric current does not flow easily, and static electricity is not easily dissipated.

When the average particle size of the carbon particles is more than 15 μm, the irregularities on the surface of the protective layer are too large.

In the electromagnetic wave shielding film of the present invention, the amount of the carbon particles in the protective layer is preferably 5 to 30 wt %.

When the amount of the carbon particles is in the above range, the surface resistivity of the protective layer can be set to $1.0 \times 10^5$ to $2.0 \times 10^{12} \Omega/\square$. In addition, the protective layer can be suitably made in black, resulting in higher concealability.

The electromagnetic wave shielding film of the present invention may include the protective layer, an insulating layer, a metal layer that functions as the shielding layer, and a conductive adhesive layer that are sequentially stacked.

The electromagnetic wave shielding film of the present invention may include the protective layer, an insulating layer, and a conductive adhesive layer that functions as the shielding layer that are sequentially stacked.

The electromagnetic wave shielding films having one of these features have sufficient electromagnetic wave shielding properties.

Since the protective layer is formed outermost, static electricity that has accumulated can be quickly dissipated.

Advantageous Effects of Invention

The present invention can provide an electromagnetic wave shielding film from which static electricity that has accumulated during production or transfer can be easily dissipated.

DESCRIPTION OF EMBODIMENTS

Figure 1:
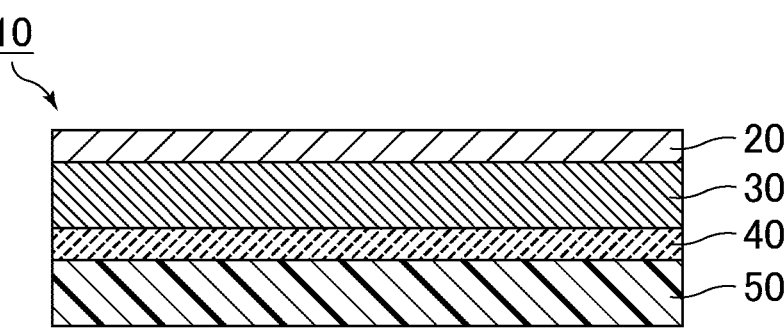
FIG. 1 is a schematic cross-sectional view of an example of an electromagnetic wave shielding film according to a first embodiment of the present invention.

The electromagnetic wave shielding film of the present invention is specifically described below. However, the present invention is not limited to the following embodiments and can be appropriately modified without changing the gist of the invention.

First Embodiment

First, an electromagnetic wave shielding film according to the first embodiment of the present invention is described with reference to the drawing.

FIG. 1 is a schematic cross-sectional view of an example of the electromagnetic wave shielding film according to the first embodiment of the present invention.

An electromagnetic wave shielding film 10 shown in FIG. 1 includes a protective layer 20, an insulating layer 30, a metal layer 40, and a conductive adhesive layer 50 that are sequentially stacked.

In the electromagnetic wave shielding film 10, the metal layer 40 functions as a shielding layer. In the electromagnetic wave shielding film 10, the protective layer 20 is disposed outermost, and the metal layer 40 is disposed inward therefrom.

In the electromagnetic wave shielding film 10, the protective layer 20 has a surface resistivity of $1.0 \times 10^5$ to $2.0 \times 10^{12} \Omega/\square$. The surface resistivity of the protective layer 20 is preferably $1.0 \times 10^6$ to $1.0 \times 10^{11} \Omega/\square$, more preferably $1.0 \times 10^7$ to $1.0 \times 10^9 \Omega/\square$.

When the surface resistivity of the protective layer 20 is in the above range, the protective layer 20 can diffuse static electricity, so that even when static electricity accumulates in the protective layer 20, the static electricity that has accumulated in the protective layer 20 can be quickly dissipated by earthing.

As a result, static electricity is less likely to accumulate in the entire electromagnetic wave shielding film 10.

When the surface resistivity is less than $1.0 \times 10^5 \Omega/\square$, static electricity can be dissipated instantly, but dissipation of static electricity tends to cause sparks.

When the surface resistivity is more than $2.0 \times 10^{12} \Omega/\square$, even when the protective layer is earthed, electric current does not flow easily. Thus, static electricity is not easily dissipated.

In the electromagnetic wave shielding film 10, the protective layer 20 contains a binder resin and carbon particles having an average particle size of 0.1 to 15 μm. The average particle size of the carbon particles is preferably 1 to 10 μm.

When the protective layer 20 contains carbon particles having an average particle size in the above range, the carbon particles are moderately exposed on the surface of the protective layer 20, and the surface resistivity of the protective layer 20 can be set to $1.0 \times 10^5$ to $2.0 \times 10^{12} \Omega/\square$. In addition, since irregularities are formed on the surface of the protective layer 20, the gloss of the protective layer 20 can be reduced. Thus, even when the protective layer 20 is scratched or the like, scratch marks or the like are not easily visible.

When the average particle size of the carbon particles is less than 0.1 μm, the carbon particles are buried in the protective layer and are less likely to be exposed on the surface of the protective layer. Thus, even when the protective layer is earthed, electric current does not flow easily, and static electricity is not easily dissipated.

When the average particle size of the carbon particles is more than 15 μm, the irregularities on the surface of the protective layer are too large.

The carbon particles may form secondary particles with a size of preferably 1 to 15 μm.

The term "average particle size of the carbon particles" as used herein refers to an average of measurements of major axes of five primary carbon particles that are randomly selected from an image of the surface (vertical×horizontal=250 μm×350 μm) of the protective layer 20 taken with Keyence digital microscope VHX-5000 at a magnification of 1000 times.

In the electromagnetic wave shielding film 10, the amount of the carbon particles in the protective layer 20 is preferably 5 to 30 wt %, more preferably 10 to 30 wt %.

When the amount of the carbon particles is in the above range, the surface resistivity of the protective layer 20 can be set to $1.0 \times 10^5$ to $2.0 \times 10^{12} \Omega/\square$.

When the amount of the carbon material in the protective layer is less than 5 wt %, the surface resistivity of the protective layer tends to fall outside of a good range.

When the amount of the carbon material in the protective layer is more than 30 wt %, the irregularities on the surface of the protective layer are too large, which easily results in a lower scratch resistance.

The type of the carbon particles is not limited as long as the surface resistivity of the protective layer 20 can be adjusted. For example, amorphous carbon, graphite, or the like may be used.

In the electromagnetic wave shielding film 10, the protective layer 20 may contain another carbon material, other than the carbon particles. The surface resistivity of the protective layer 20 can be adjusted with such a carbon material.

The shape of the carbon material other than the carbon particles is not limited. For example, carbon fibers, carbon nanotubes, or the like can be used.

The binder resin contained in the protective layer 20 is preferably made of a thermoplastic resin, a thermosetting resin, an active energy ray-curable resin, or the like.

The thermoplastic resin is not limited. Examples include styrene resins, vinyl acetate resins, polyester resins, polyethylene resins, polypropylene resins, imide resins, and acrylic resins.

The thermosetting resin is not limited. Examples include phenolic resins, epoxy resins, urethane resins, melamine resins, and alkyd resins.

The active energy ray-curable resin composition is not limited. Examples include a polymerizable compound having at least two (meth)acryloyloxy groups in the molecule.

The binder resin contained in the protective layer 20 may include a single material or two or more materials.

The protective layer 20 may contain additives such as curing accelerators, tackifiers, antioxidants, pigments, dies, plasticizers, UV absorbers, defoamers, leveling agents, fillers, flame retardants, viscosity modifiers, and anti-blocking agents, as needed.

The thickness of the protective layer 20 is not limited, and it can be suitably set as needed. Yet, it is preferably 0.1 to 15 μm, more preferably 1 to 10 μm.

Preferably, the protective layer 20 is black. The protective layer 20 in black has a higher concealability and improves design.

L*, a*, and b* of the protective layer 20 in the L*a*b* color system are preferably 10 to 30, 0.1 to 10, and −5 to 5, respectively.

The scratch hardness of the protective layer 20 based on JIS K 5600-5-4 is preferably H or more, more preferably 2H or more.

The protective layer 20 having a scratch hardness of H or more has a higher scratch resistance and is less likely to peel off. Thus, a good appearance can be maintained.

The surface roughness Ra of the protective layer 20 is preferably 5.0 μm or less, more preferably 3.0 to 0.1 μm.

The protective layer 20 having a surface roughness Ra of 5.0 μm or less has a good scratch resistance.

The gloss at 85° of the protective layer 20 is preferably 30 to 80, more preferably 40 to 60, as measured by a BYK Gardner micro-TRI-gloss meter.

The protective layer 20 having a gloss at 85° in the above range has a small surface roughness Ra and a good scratch resistance.

In the electromagnetic wave shielding film 10, the insulating layer 30 may be made of any material. Preferably, the insulating layer 30 is made of a material such as a thermoplastic resin composition, a thermosetting resin composition, or an active energy ray-curable resin composition.

The thermoplastic resin composition is not limited. Examples include styrene resin compositions, vinyl acetate resin compositions, polyester resin compositions, polyethylene resin compositions, polypropylene resin compositions, imide resin compositions, and acrylic resin compositions.

The thermosetting resin composition is not limited. Examples include phenolic resin compositions, epoxy resin compositions, urethane resin compositions, melamine resin compositions, alkyd resin compositions, imide resin composition, and amide resin compositions.

The active energy ray-curable resin composition is not limited. Examples include a polymerizable compound having at least two (meth)acryloyloxy groups in the molecule.

The insulating layer 30 may be made of a single material or two or more materials.

The insulating layer 30 may contain additives such as curing accelerators, tackifiers, antioxidants, pigments, dies, plasticizers, UV absorbers, defoamers, leveling agents, fillers, flame retardants, viscosity modifiers, and anti-blocking agents, as needed.

The thickness of the insulating layer 30 is not limited, and it can be suitably set as needed. Yet, it is preferably 0.1 to 15 μm, more preferably 1 to 10 μm.

The term "insulating layer" as used herein refers to a resin layer having a surface resistivity of more than $2.0 \times 10^{12} \Omega/\square$.

In the electromagnetic wave shielding film 10, the metal layer 40 may be metal foil, a metal plating layer, a metal deposition layer, or the like.

Preferably, the metal layer 40 is made of a material such as gold, silver, copper, aluminum, nickel, tin, palladium, chromium, titanium, zinc, or an alloy of any of these metals. The metal layer 40 made of any of these metals has better shielding properties.

Of these, a copper layer and a silver layer are preferred in terms of excellent shielding properties from high-frequency band electromagnetic waves; and a copper layer is preferred in terms of economic efficiency.

The thickness of the metal layer 40 is preferably 0.1 to 10 μm, more preferably 1 to 6 μm.

The metal layer 40 having a thickness of less than 0.1 μm tends to have poor shielding properties.

The shielding properties will hardly improve even when the thickness of the metal layer 40 is more than 10 μm. Thus, by setting the thickness to 10 μm or less, costs can be kept down while the shielding properties are maximized. In addition, an electronic device equipped with the electromagnetic wave shielding film of the present invention can also be designed small.

In the electromagnetic wave shielding film 10, the conductive adhesive layer 50 may have isotropic conductivity or may have anisotropic conductivity.

As described above, the conductive adhesive layer 50 is disposed on a printed wiring board. In such a case, contact of the conductive adhesive layer 50 having either isotropic conductivity or anisotropic conductivity with a ground wire of the printed wiring board allows the ground wire of the printed wiring board to be electrically connected to the metal layer 40 of the electromagnetic wave shielding film 10 via the conductive adhesive layer 50. This allows the electromagnetic wave shielding film 10 to suitably block electromagnetic waves.

The conductive adhesive layer 50, when it has anisotropic conductivity, results in better transmission characteristics of high frequency signals that are transmitted via a signal circuit of the printed wiring board than when it has isotropic conductivity.

The conductive adhesive layer 50 contains a conductive filler and an adhesive resin.

The conductive adhesive layer 50 may contain any conductive filler. Examples include silver powder, copper powder, nickel powder, solder powder, aluminum powder, silver-coated copper powder (silver-plated copper powder), fine particles (such as polymer fine particles and glass beads) coated with metal, and the like.

Of these, inexpensively available copper powder or silver-coated copper powder is preferred in terms of economic efficiency.

The shape of the conductive filler is not limited, and it can be suitably selected from shapes such as spherical, flaky, scaly, dendrite, rod, and fibrous shapes. Of these, a flaky shape is preferred.

In the case where the conductive filler is a flaky conductive filler, when the electromagnetic wave shielding film 10 is bent, the conductive filler is also bent. This facilitates maintenance of contact between particles of the conductive filler. As a result, the conductivity of the conductive adhesive layer is less likely to be reduced.

The average major axis of the conductive filler is not limited, but it is preferably 0.5 to 15.0 μm, more preferably 5 to 13.0 μm.

When the average major axis of the conductive filler is 0.5 μm or more, the conductive adhesive layer has better conductivity.

When the average major axis of the conductive filler is 15.0 μm or less, the conductive adhesive layer can be made thin.

The term "average major axis of the conductive filler" as used herein refers to a value measured by the following method.

A scanning electron microscopic (SEM) image of a cross section obtained by cutting the conductive adhesive layer is taken. The average major axis of the conductive filler refers to an average major axis of any five particles of the conductive filler in the SEM image.

The weight percentage of the conductive filler contained in the conductive adhesive layer 50 is preferably 10 to 80 wt %.

When the conductive adhesive layer 50 has anisotropic conductivity, the weight percentage of the conductive filler contained in the conductive adhesive layer 50 is preferably 10 to 40 wt %, more preferably 15 to 35 wt %.

The thickness of the conductive adhesive layer 50 is not limited, and it can be suitably set as needed. Yet, it is preferably 0.5 to 30.0 μm.

When the thickness of the conductive adhesive layer is less than 0.5 μm, good conductivity is difficult to obtain.

When the thickness of the conductive adhesive layer is more than 30.0 μm, the electromagnetic wave shielding film is thick as a whole and difficult to handle.

The adhesive resin contained in the conductive adhesive layer 50 may be made of any material. Examples that can be used include thermoplastic resins such as styrene resins, vinyl acetate resins, polyester resins, polyethylene resins, polypropylene resins, imide resins, amide resins, and acrylic resins, and thermosetting resins such as phenolic resins, epoxy resins, urethane resins, melamine resins, and alkyd resins.

The material of the adhesive resin of the conductive adhesive layer 50 may include one of these examples or a combination of two or more thereof.

Next, the principle that causes quick dissipation of static electricity from the electromagnetic wave shielding film of the present invention is described with reference to the drawing.

Figure 2:
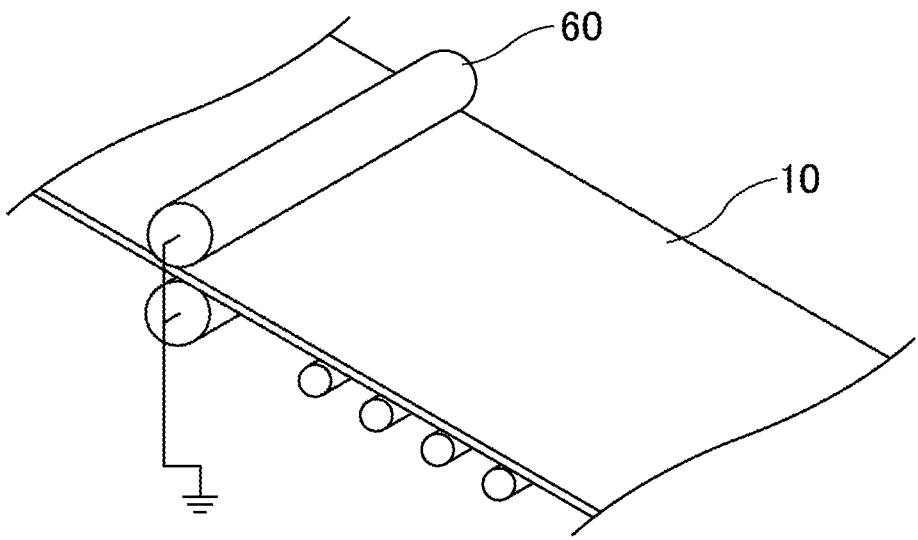
FIG. 2 is a schematic operational view of an example in which the electromagnetic wave shielding film according to the first embodiment of the present invention is transferred between rollers.

FIG. 2 is a schematic operational view of an example in which the electromagnetic wave shielding film according to the first embodiment of the present invention is transferred between rollers.

When the electromagnetic wave shielding film 10 is transferred between rollers using a roller device 60 as shown in FIG. 2, static electricity is generated in the electromagnetic wave shielding film 10 due to friction by contact between the roller device 60 and the electromagnetic wave shielding film 10.

When the roller device 60 is earthed as shown in FIG. 2, current flows to the earth from the protective layer, which is disposed outermost, of the electromagnetic wave shielding film 10, and static electricity can be quickly dissipated.

When no protective layer is formed in the electromagnetic wave shielding film and an insulating layer is disposed outermost, electric current does not flow easily through the insulating layer and static electricity that has accumulated in the insulating layer does not easily flow into the earth even when the roller device is earthed. Thus, the state where static electricity is accumulated tends to persist.

In FIG. 2, the roller device 60 is earthed. The earthing point is not limited as long as static electricity can be dissipated from the electromagnetic wave shielding film of the present invention.

Second Embodiment

Next, an electromagnetic wave shielding film according to the second embodiment of the present invention is described with reference to the drawing.

Figure 3:
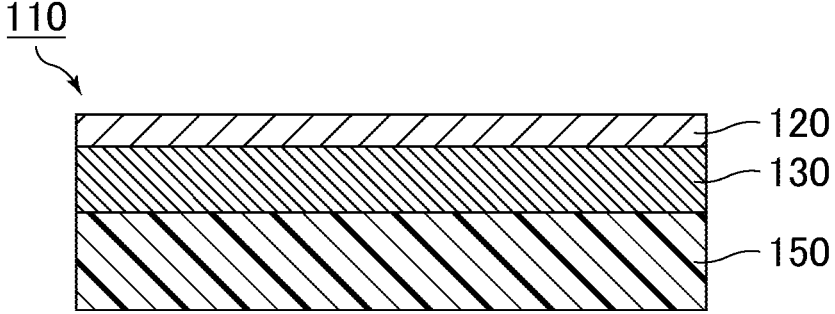
FIG. 3 is a schematic cross-sectional view of an example of an electromagnetic wave shielding film according to a second embodiment of the present invention.

FIG. 3 is a schematic cross-sectional view of an example of the electromagnetic wave shielding film according to the second embodiment of the present invention.

An electromagnetic wave shielding film 110 shown in FIG. 3 includes a protective layer 120, an insulating layer 130, and a conductive adhesive layer 150 that are sequentially stacked.

In the electromagnetic wave shielding film 110, the conductive adhesive layer 150 functions as a shielding layer. In the electromagnetic wave shielding film 110, the protective layer 120 is disposed outermost, and the conductive adhesive layer 150 disposed inward therefrom.

In the electromagnetic wave shielding film 110, preferred features of the protective layer 120 and the insulating layer 130 are the same as the preferred features of the protective layer 20 and the insulating layer 30 of the electromagnetic wave shielding film 10.

In the electromagnetic wave shielding film 110, the conductive adhesive layer 150 has isotropic conductivity and functions as a shielding layer. Other than the above-described feature and function, preferred features of the conductive adhesive layer 150 are the same as the preferred features of the conductive adhesive layer 50 of the electromagnetic wave shielding film 10.

Static electricity that has accumulated in the electromagnetic wave shielding film 110 can be quickly dissipated as in the electromagnetic wave shielding film 10.

Other Embodiments

The electromagnetic wave shielding films according to the first embodiment and the second embodiment each include an insulating layer between the protective layer and the shielding layer (metal layer or conductive adhesive layer). Yet, in the electromagnetic wave shielding film of the except that the amount of graphite particles contained in the protective layer was varied as shown in Table 1.

Comparative Example 1

An electromagnetic wave shielding film according to Comparative Example 1 was produced as in Example 1, except that no protective layer was formed.

TABLE 1

| | Example 1 | Example 2 | Example 3 | Example 4 | Example 5 | Comparative Example 1 |
|---|---|---|---|---|---|---|
| Amount of carbon particles in protective layer (wt %) | 5 | 10 | 20 | 30 | 50 | — |
| Surface resistivity (Ω/□) | $1.92 \times 10^{12}$ | $2.20 \times 10^{10}$ | $2.62 \times 10^{8}$ | $3.11 \times 10^{7}$ | $1.26 \times 10^{6}$ | N.D. |
| Steel wool adhesion test | Δ | ○ | ○ | ○ | ○ | x |
| Scratch hardness | 7H | 5H | 2H | H | F | 7H |
| Surface roughness Ra (μm) | 0.05 | 0.08 | 0.19 | 3.23 | 3.69 | 1.25 |
| Gloss at 85° | 59.6 | 50 | 46 | 37 | 35 | 21.1 |
| Concealability | x | Δ | ○ | ○ | ○ | x |

N.D.: Surface resistivity exceeding measurement limit due to insulation.

present invention, the protective layer and the shielding layer may be in direct contact with each other.

EXAMPLES

The present invention is described more specifically below with reference to examples, but the present invention is not limited to these examples.

Example 1

First, a release-treated support film made of polyethylene terephthalate was prepared.

Next, polyester melamine (80 parts by weight) as a binder resin was mixed with graphite particles having an average particle size of 5 μm (20 parts by weight) as a carbon material, whereby a protective layer composition was produced.

The average particle size of the graphite particles is the result measured based on the above-described method for measuring the average particle size of the carbon particles after production of the protective layer composition.

Subsequently, the protective layer composition was applied to the support film to a thickness of 5 μm, whereby a protective layer was obtained.

Next, an adhesive resin made of an epoxy resin was applied to the protective layer to a thickness of 5 μm, whereby an insulating layer was formed.

Next, copper foil having a thickness of 1 μm was placed on the insulating layer, whereby a metal layer was obtained.

Next, an epoxy resin (35 wt %) as an adhesive resin was mixed with copper powder (65 wt %) as a conductive filler, whereby a conductive adhesive was prepared. Subsequently, the metal layer was coated with the conductive adhesive to a thickness of 5 μm, whereby a conductive adhesive layer was formed. The coating was performed by a dip coating method.

An electromagnetic wave shielding film according to Example 1 was produced by the above steps.

(Example 2) to (Example 5)

Electromagnetic wave shielding films according to Example 2 to Example 5 were produced as in Example 1, (Surface Resistivity Measurement)

The protective layers of the electromagnetic wave shielding films according to Examples and the insulating layer of the electromagnetic wave shielding film according to Comparative Example 1 were subjected to measurement of surface resistivity using an ultra-high resistance meter 8340A available from ADC Corporation. Table 1 shows the results.

(Steel Wool Adhesion Test)

Each of the electromagnetic wave shielding films according to Examples and Comparative Example was cut into a test piece with a size of vertical× horizontal=250 mm×250 mm.

Steel wool powder was placed on the protective layer of the test piece (the insulating layer in the case of the test piece according to Comparative Example 1) to a degree that makes the protective layer invisible. Subsequently, the test piece was turned upside down to make the steel wool powder fall off from the test piece.

The protective layer of the test piece after making the steel wool powder fall off was visually observed and evaluated as to whether the steel wool powder was still attached to the protective layer due to static electricity. Table 1 shows the results.

The evaluation criteria are as follows.

○ (good): The steel wool powder attachment area was less than 30% relative to the entire surface of the protective layer (insulating layer).

Δ (fair): The steel wool powder attachment area was 30% or more and less than 50% relative to the entire surface of the protective layer (insulating layer).

x (poor): The steel wool powder attachment area was 50% or more relative to the entire surface of the protective layer (insulating layer).

(Scratch Hardness Measurement)

The protective layers of the electromagnetic wave shielding films according to Examples and the insulating layer of the electromagnetic wave shielding film according to Comparative Example 1 were subjected to measurement of scratch hardness based on JIS K 5600 May 4 under the following conditions: load: 750±10 g; pencil angle: 45°; scratching speed: 0.5 to 1.0 mm/s; and pencil used: Uni available from Mitsubishi Pencil Company. Table 1 shows the results.

(Surface Roughness Measurement)

The protective layers of the electromagnetic wave shielding films according to Examples and the insulating layer of the electromagnetic wave shielding film according to Comparative Example 1 were subjected to measurement of surface roughness Ra using PTELICS H1200 available from Lasertec Corporation. Table 1 shows the results.

(Gloss at 85° Measurement)

The protective layers of the electromagnetic wave shielding films according to Examples and the insulating layer of the electromagnetic wave shielding film according to Comparative Example 1 were subjected to measurement of gloss at 85° using a BYK Gardner micro-TRI-gloss meter. Table 1 shows the results.

(Concealability Test)

The concealability of each of the electromagnetic wave shielding films according to Examples and Comparative Example was visually evaluated.

The evaluation criteria are as follows. Table 1 shows the results.

- ○ (good): The metal layer was not visible when the electromagnetic wave shielding film was visually checked from the protective layer-side (insulating layer-side in Comparative Example 1).
- Δ (fair): The metal layer was slightly visible when the electromagnetic wave shielding film was visually checked from the protective layer-side (insulating layer-side in Comparative Example 1).
- x (poor): The metal layer was visible when the electromagnetic wave shielding film was visually checked from the protective layer-side (insulating layer-side in Comparative Example 1).

As shown in Table 1, in each of the electromagnetic wave shielding films according to Examples, the surface resistivity of the protective layer was confirmed to be $1.0 \times 10^5$ to $2.0 \times 10^{12} \Omega/\square$. The results of the steel wool powder adhesion test found that static electricity was easily dissipated from the electromagnetic wave shielding films according to Examples.

REFERENCE SIGNS LIST

10, 110 electromagnetic wave shielding film
20, 120 protective layer
30, 130 insulating layer
40 metal layer
50, 150 conductive adhesive layer
60 roller device

The invention claimed is:

1. An electromagnetic wave shielding film comprising:
   a protective layer disposed outermost; and
   a shielding layer stacked inward from the protective layer,
   wherein the protective layer has a surface resistivity of $1.0 \times 10^5$ to $2.0 \times 10^{12} \Omega/\square$, and
   the protective layer contains a binder resin and carbon particles having an average particle size of 0.1 to 15 μm.

2. The electromagnetic wave shielding film according to claim 1,
   wherein an amount of the carbon particles in the protective layer is 5 to 30 wt %.

3. The electromagnetic wave shielding film according to claim 1,
   wherein the electromagnetic wave shielding film comprises the protective layer, an insulating layer, a metal layer that functions as the shielding layer, and a conductive adhesive layer that are sequentially stacked.

4. The electromagnetic wave shielding film according to claim 1,
   wherein the electromagnetic wave shielding film comprises the protective layer, an insulating layer, and a conductive adhesive layer that functions as the shielding layer that are sequentially stacked.

*   *   *   *   *